(12) United States Patent
Ishikawa (10) Patent No.: US 6,747,493 B2
(45) Date of Patent: Jun. 8, 2004

(54) POWER-ON RESET CIRCUIT (75) Inventor: Yasuaki Ishikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/389,902

(22) Filed: Mar. 18, 2003

(65) Prior Publication Data
US 2003/0179023 A1 Sep. 25, 2003

(30) Foreign Application Priority Data
Mar. 19, 2002 (JP) ........................................ 2002-075395

(51) Int. Cl.[7] .................................................. H03L 7/00
(52) U.S. Cl. ........................................ 327/143; 327/198
(58) Field of Search ................................. 327/142, 143, 327/198

(56) References Cited

U.S. PATENT DOCUMENTS

| | | |
|---|---|---|
| 5,323,066 A | 6/1994 | Feddeler et al. |
| 5,343,085 A * | 8/1994 | Fujimoro et al. ............ 327/143 |
| 5,703,512 A | 12/1997 | McClure |
| 5,739,708 A * | 4/1998 | LeWalter ..................... 327/143 |
| 6,144,237 A | 11/2000 | Ikezaki |

FOREIGN PATENT DOCUMENTS

JP 8-63264 A 3/1996

* cited by examiner

Primary Examiner—Jeffrey Zweizig
(74) Attorney, Agent, or Firm—Sughrue Mion, PLLC (57) ABSTRACT A power-on reset circuit has a configuration comprising an input circuit which is initialized by the assertion of a power-on reset signal entered from outside when power supply is turned on and supplies a first signal of a first logical value at the time a detection signal is entered, a reset extending circuit which is initialized by the assertion of the power-on reset signal and, after the power-on reset signal is negated, supplies a second signal which takes on a second logical value when an external clock signal is first entered and a third logical value after the lapse of a prescribed length of time determined by counting the external clock signals after the first signal of the first logical value is entered, a detecting circuit which is initialized by the assertion of the power-on reset signal and, after the power-on reset signal is negated, caused to generate the detection signal by the input of the second signal of the second logical value from the reset extending circuit and to supply it to the input circuit, and a gate circuit which supplies a reset signal of a prescribed logical value when the first signal of the first logical value is supplied from the input circuit and the second signal of the third logical value is supplied from the reset extending circuit.

8 Claims, 8 Drawing Sheets

POWER-ON RESET CIRCUIT

BACKGROUND OF THE INVENTION

1. Field of the Invention

The present invention relates to a power-on reset circuit, and more particularly to a power-on reset circuit which generates a power-on reset signal when power supply to an apparatus is turned on.

2. Description of the Related Art

A power-on reset circuit would be installed for one or the other of two purposes. One is to initialize circuits when power supply to an apparatus is turned on. The other is to extend a reset signal to prevent, in a digital communication apparatus having a rack configuration, unstable operations of the power supply system and the clock line when each package power supply is actuated at the time of live insertion or extraction from sending abnormal signals to a signal line shared by a plurality of packages via a mother board in the apparatus. A reset extending circuit might also be used for extending to a certain extent the length of time from actuating power supply to release of the reset to stabilize the operation of integrated circuits.

Whereas the action at the time of actuating power supply differs from circuit to circuit depending on the circuit configuration, it is desirable to have available a power-on reset circuit which need not be adjusted to match the difference in action and, while the lengths of time taken to actuate power supply, to start the clock output and to achieve stability differ every time, the power-on reset circuit is desired to be able to initialize the circuits securely by a power-on reset.

Figure 6:
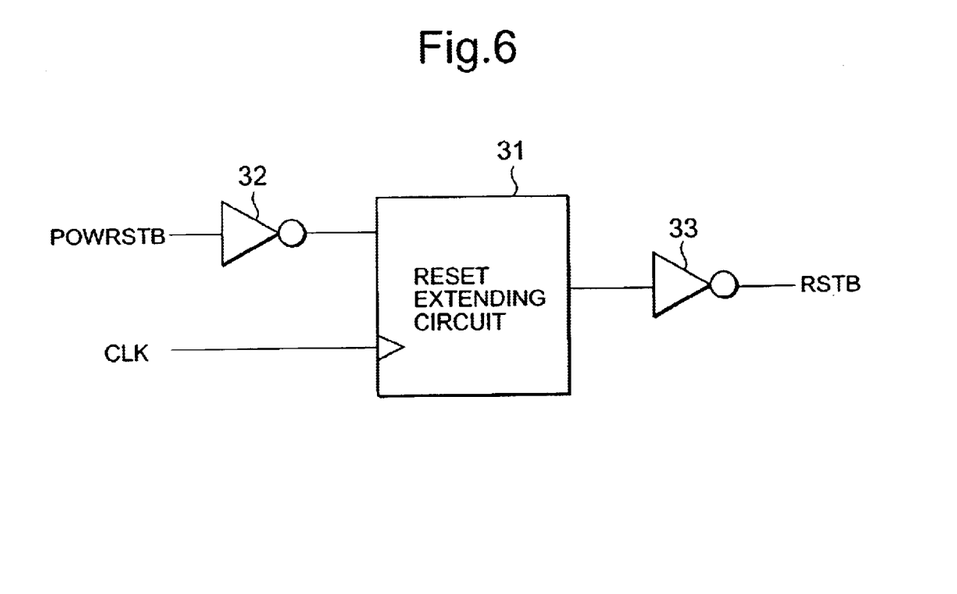
FIG. 6 is a block diagram of an example of the prior art.

According to the prior art, a power-on reset extending circuit shown in FIG. 6 is used as a synchronous circuit. In FIG. 6, a reset extending circuit 31 is supplied with an external power-on reset signal POWRSTB via an inverter 32. If a clock signal CLK is inputted to a clock terminal when the logical value of that input signal POWRSTB via an inverter 32 is "H", the reset extending circuit 31 supplies from an inverter 33 a signal RSTB of "L" in logical value, extended for a prescribed length of time.

Figure 7:
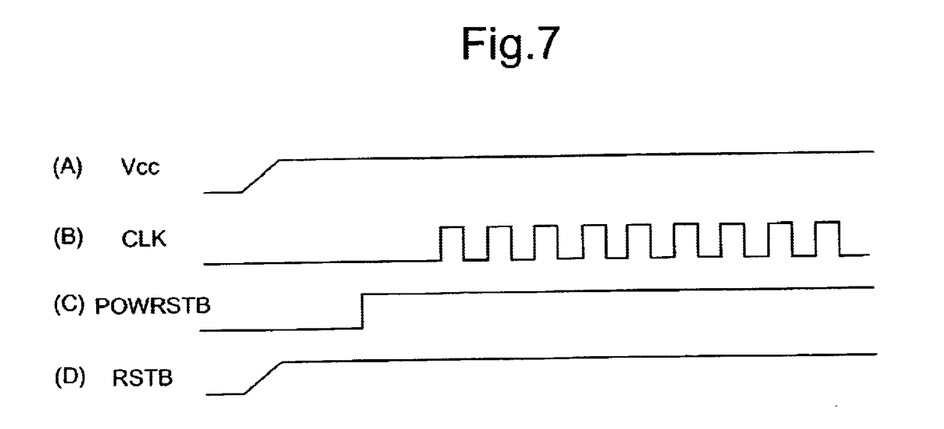

However, depending on the timing at which power supply is turned on, the output signal RSTB shown in FIG. 7(D) may fail to, vary, remaining at the value of "H". This would occur when, as shown in FIG. 7(C), the external power-on reset signal POWRSTB is supplied to the reset extending circuit 31 via the inverter 32 and, after the logical value of that input signal has varied to "L" (that of the POWRSTB signal is "H"), the clock signal CLK is inputted to the clock terminal as shown in FIG. 7(B).

Thus the reset extending circuit 31, in a situation in which the input of the clock signal CLK is suspended when a power-on reset signal is asserted, cannot detect the input of the power-on reset signal POWRSTB and accordingly cannot extend the reset signal. In such a case, abnormal signals may be transmitted to a signal line shared by a plurality of packages or the operation of the integrated circuits into which the output signal RSTB is entered may be destabilized. Incidentally, FIG. 7(A) shows a source voltage VCC, in response to whose actuation the output signal RSTB also varies to the "H" level as shown in FIG. 7(D).

Figure 8:
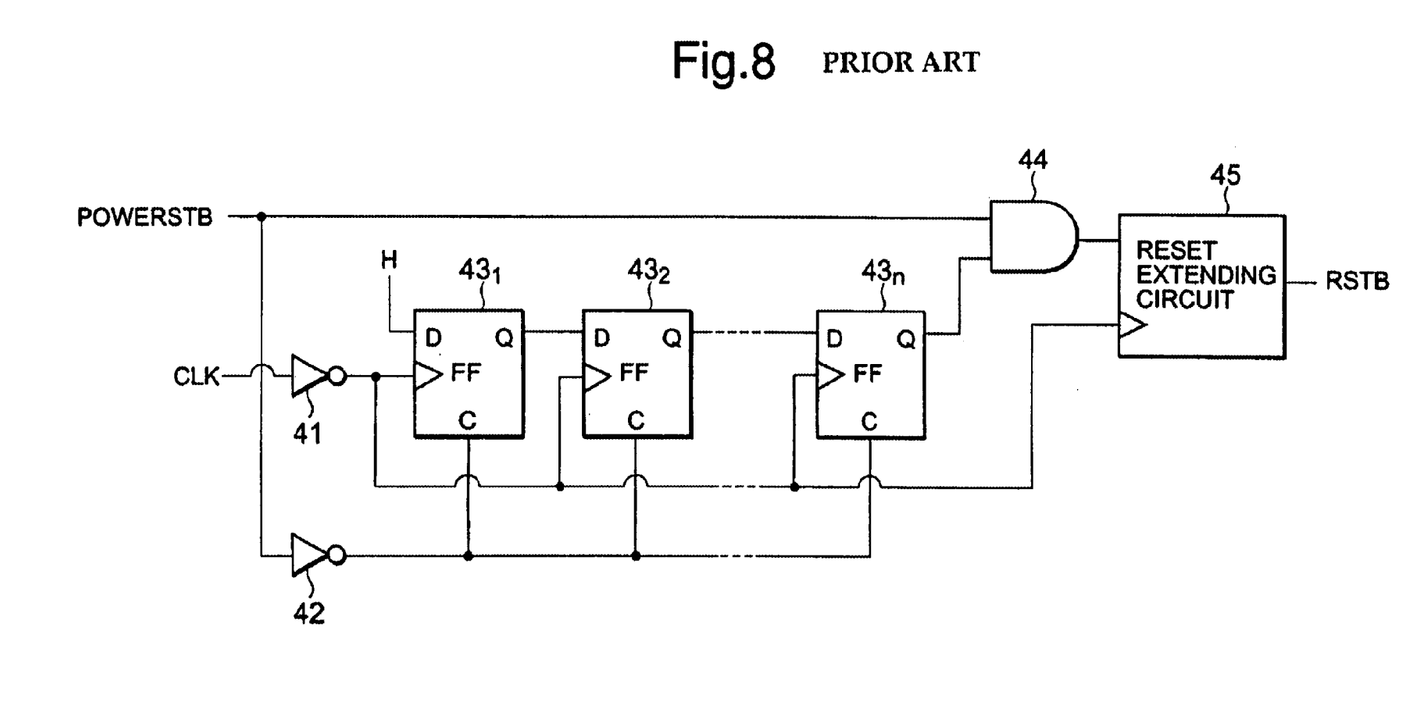
FIG. 8 is a circuit diagram of another example of the prior art.

In contrast to the foregoing, as described in the Japanese Patent Application Laid-open No. Hei 8-63264, a power-on reset circuit according to the prior art shown in FIG. 8 can reliably detect a power-on reset even if the input of a clock CLK is suspended while a power-on reset signal POWRSTB is being asserted. Thus, referring to FIG. 8, the clock signal CLK is supplied in common to the clock terminals of D type flip-flops (D-FFs) 431 through 43n which are cascade-connected in n stages via an inverter 41. The "H" level is constantly supplied to the D-FF 431 of the first stage all the time. The Q output signal of the D-FF 43n of the final stage is supplied to an AND gate 44, and its logical product of multiplication by an external power-on reset signal POWRSTB is supplied to a reset extending circuit 45.

Figure 9:
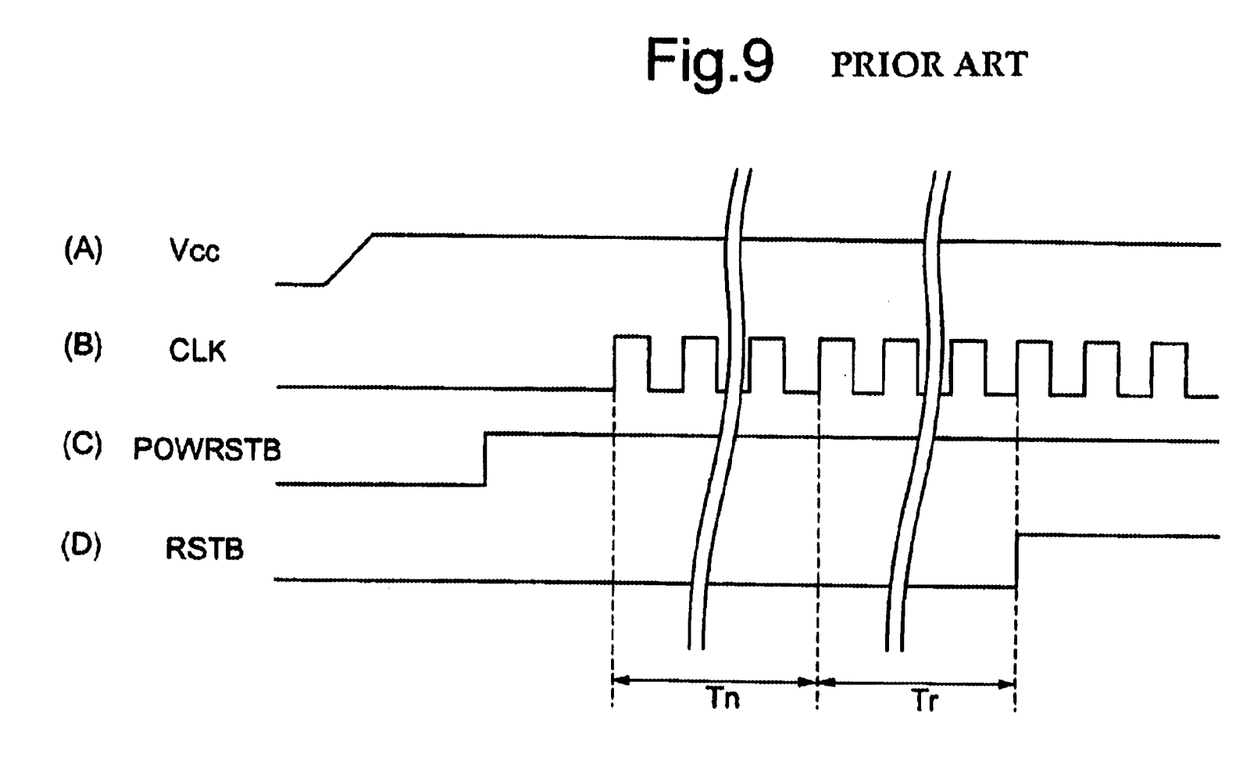

In this power-on reset circuit according to the prior art, immediately after the turning-on of power supply raises the source voltage VCC to the "H" level as shown in FIG. 9(A), the external power-on reset signal POWRSTB rises to the "H" level as shown in FIG. 9(C) and is commonly supplied to the clear terminals of the D-FFs 431 through 43n via an inverter 42 to initialize them, and after that a clock signal CLK is entered as shown in FIG. 9(B). Then, every time the clock signal CLK rises and is entered, the "H" level supplied to the D input terminal of the D-FF 431 of the first stage is successively transferred to the D-FF of the next stage, the Q output signal of the D-FF 43n of the final stages stays at the "H" level from the point of time when n clock signals CLK have risen and been entered (the point of time when n clock cycles Tn have passed since the input time of the first clock signal CLK as shown in FIG. 9), and signals of the "H". level are outputted from the AND gate 44 to be supplied to the reset extending circuit 45.

The reset extending circuit 45 counts the clock signals CLK supplied via the inverter 41 as long as the signals of the "H" level are supplied from the AND gate 44 and, when a predetermined number has been counted (when a period Tr has passed after the lapse of the aforementioned period Tn), supplies the output signal RSTB of the "H" level as shown in FIG. 9(D). This power-on reset circuit according to the prior art can supply the output signal RSTB of a prescribed level at a point of time when the aforementioned period (Tn+Tr) has passed since the first input of the clock signal CLK even if any clock signal CLK is entered after the input of the external power-on reset signal POWRSTB.

However, while the power-on reset circuit according to the prior art shown in FIG. 8 above has a configuration in which the external power-on reset signal POWRSTB is delayed by n clock cycles Tn by using the D-FFs 431 through 43n which are cascade-connected in n stages, it is not confirmed whether or not this external power-on reset signal POWRSTB delayed by n clock cycles Tn is detected without fail by the reset extending circuit 45 of the next stage.

For this reason, even if the power-on reset circuit according to the prior art shown in FIG. 8 above permits elongation of the aforementioned delay time Tn by increasing the number n of the D-FFs, the characteristics of the following reset extending circuit 45 should be judged and adjustment be made accordingly, and this inevitably requires pertinent know-how.

An object of the present invention, attempted in view of the problems noted above, is to provide a power-on reset circuit capable of releasing the power-on reset after it has been confirmed that a reset extending circuit has detected a power-on reset signal without fail and without having to add otherwise unnecessary flip-flops and to adjust them.

Another object of the invention is to provide a power-on reset circuit capable of making available a stable system which would not supply any abnormal signal to a common signal line and be free from erroneous operation as an apparatus of a rack configuration.

SUMMARY OF THE INVENTION

In order to achieve the objects stated above, a power-on reset circuit according to the invention comprises an input circuit which is initialized by the assertion of a power-on reset signal entered from outside when power supply is turned on and supplies a first signal of a first logical value at the time a detection signal is entered, a reset extending circuit which is initialized by the assertion of the power-on reset signal and, after the power-on reset signal is negated, supplies a second signal which takes on a second logical value when an external clock signal is first entered and a third logical value after the lapse of a prescribed length of time determined by counting the external clock signals after the first signal of the first logical value is entered, a detecting circuit which is initialized by the assertion of the power-on reset signal and, after the power-on reset signal is negated, caused to generate the detection signal by the input of the second signal of the second logical value from the reset extending circuit and to supply it to the input circuit, and a gate circuit which supplies a reset signal of a prescribed logical value when the first signal of the first logical value is supplied from the input circuit and the second signal of the third logical value is supplied from the reset extending circuit.

According to the invention, since the external input power-on reset signal asserted at the time power supply is turned on is negated, the second signal is supplied after the external clock signal is entered and it is confirmed that the reset extending circuit has detected the power-on reset signal, and the detecting circuit supplies the detection signal on the basis of this second signal and supplies a reset signal of a prescribed logical value via the input circuit and the gate circuit, the power-on reset signal can be supplied to integrated circuits mounted on the package, for instance, without fail even if the input of the external clock signal is suspended while the power-on reset signal is being asserted and without having to take into consideration the timing at which the input of the external clock signal is started or the length of time taken by the reset extending circuit to detect the power-on reset signal.

Also according to the invention, the power-on reset signal can be entered into integrated circuits mounted on the package until the lapse of a certain length of time from the actuation of power supply and until the connection to the signal line on the mother board is stabilized.

Further in order to achieve the objects stated above, a power-on reset circuit according to the invention comprises an input circuit which is initialized by the assertion of a power-on reset signal entered from outside when power supply is turned on or is initialized when a detection signal of a first logical value is entered and, when the power-on reset signal is negated and the detection signal of a second logical value is entered, supplies a first signal of a third logical value in synchronization with an external clock signal, a reset extending circuit which is initialized by the assertion of the power-on reset signal and, after the power-on reset signal is negated, supplies a second signal which takes on a fourth logical value when an external clock signal is first entered and a firth logical value after the lapse of a prescribed length of time determined by counting the external clock signals after the first signal of the third logical value is entered, a detecting circuit which is initialized by the assertion of the power-on reset signal and, after the power-on reset signal is negated, caused to generate the detection signal of the second logical value by the input of the second signal of the fourth logical value from the reset extending circuit in synchronism with the external clock signal and supply it to the input circuit, and a gate circuit which supplies a reset signal of a prescribed logical value when the first signal of the third logical value is supplied from the input circuit and the second signal of the fifth logical value is supplied from the reset extending circuit.

According to the invention, since the external input power-on reset signal asserted at the time power supply is turned on is negated, the second signal of the fourth logical value is supplied after the external clock signal is entered and it is confirmed that the reset extending circuit has detected the power-on reset signal, and the detecting circuit supplies the detection signal on the basis of this second signal and supplies the reset signal of the prescribed logical value via the input circuit and the gate circuit, the power-on reset signal can be supplied to integrated circuits mounted on the package, for instance, without fail even if the input of the external clock signal is suspended while the power-on reset signal is being asserted and without having to take into consideration the timing at which the input of the external clock signal is started or the length of time taken by the reset extending circuit to detect the power-on reset signal.

Also according to the invention, the power-on reset signal can be entered into integrated circuits mounted on the package until the lapse of a certain length of time from the actuation of power supply and until the connection to the signal line on the mother board is stabilized.

BRIEF DESCRIPTION OF THE DRAWINGS

FIGS. 3(A) to 3(G) are timing charts for explaining the operation of the embodiment illustrated in FIG. 1 and FIG. 2.

FIGS. 5(A) to 5(G) are timing charts for explaining the operation of the embodiment illustrated in FIG. 4.

FIGS. 7(A) to 7(D) are timing charts for explaining the problem involved in (he example of FIG. 6.

FIGS. 9(A) to 9(D) are timing charts for explaining the operation of the example illustrated in FIG. 8.

DETAILED DESCRIPTION OF THE PREFERRED EMBODIMENTS

Next will be described preferred embodiments of the present invention with reference to accompanying drawings.

Figure 1:
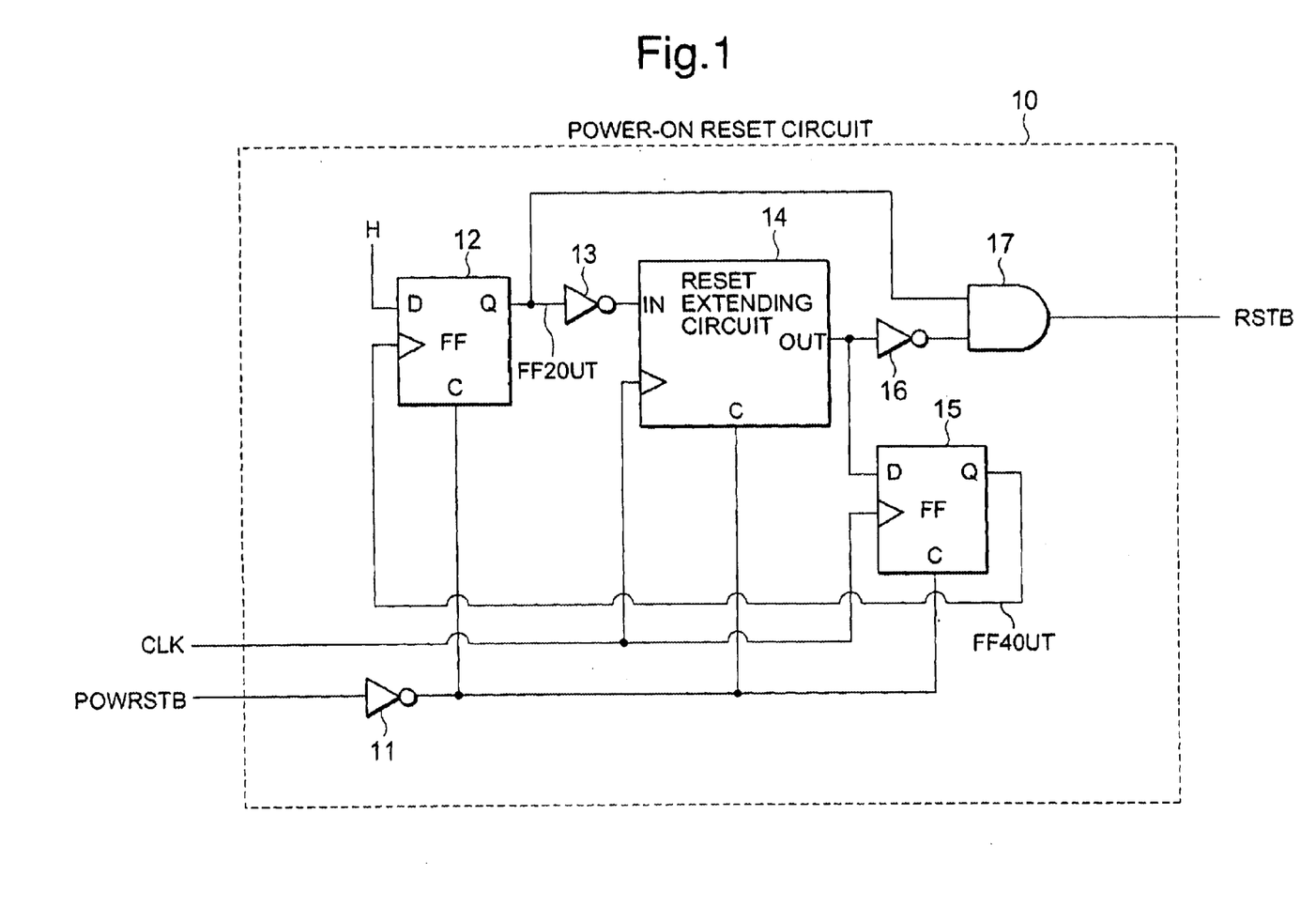
FIG. 1 is a circuit diagram of a first preferred embodiment of the present invention.

FIG. 1 is a circuit diagram of a power-on reset circuit, which is a first preferred embodiment of the invention. As illustrated in FIG. 1, the power-on reset circuit according to the invention mainly consists of inverters 11, 13 and 16, D type flip-flops (D-FFs) 12 and 15, a reset extending circuit 14 and a two-input AND gate 17. This configuration of the power-on reset circuit 10 has a function to extend for a prescribed length of time a reset output signal RSTB (Low-act) for the power-on reset circuit 10 if it checks and detects the presence of an external power-on reset signal POWRSTB (Low-act) from an external power source monitoring device, and to supply the extended signal.

The inverter 11 receives the external power-on reset signal POWRSTB as its input, and supplies a signal resulting from inversion of its logical value to the asynchronous clear terminals C of the D-FFs 12 and 15 and the reset extending circuit 14 to clear them. The D-FF 12 is supplied with the output signal of the inverter 11 at its asynchronous clear terminal C, with a signal of the "H" level all the time at its D input terminal, and with the Q output signal of the D-FF 15 at its clock input terminal, and inputs the Q output signal to the AND gate 17 and the inverter 13.

The D-FF 12, as its external power-on reset signal POWRSTB is at the "L" level and the clock signal CLK is also at the "L" level constantly when power supply is turned on, supplies an "L" level from its Q output terminal. When the Q output signal of the D-FF 15 has varied from the "L" level to the "H" level, the Q output signal of the D-FF 12 takes on the "H" level.

The inverter 13 receives the Q output signal of the D-FF 12 as its input signal, and supplies a signal resulting from inversion of its logical value to the input terminal IN of the reset extending circuit 14. The reset extending circuit 14 is supplied with the output signal of the inverter 11 at its asynchronous clear terminal C, with the output signal of the inverter 13 at its input terminal and with an external clock signal CLK at its clock input terminal, and its output signal is supplied to the inverter 16 and the D input terminal of the D-FF 15.

The reset extending circuit 14 supplies an "H" level signal upon the rise of the clock signal CLK when the "H" level is inputted to the input terminal IN and, when a prescribed length of time, which is set in a counter circuit in the reset extending circuit 14, has passed from the leading edge of the clock signal CLK next to the variation of the input signal from the input terminal IN from the "H" to the "L" level, supplies the "L" level to an output terminal OUT.

The inverter 16 receives the output signal of the reset extending circuit 14 as its input signal, and supplies a signal resulting from inversion of its logical value to the AND gate 17. The D-FF 15 is supplied with the output signal of the inverter 11 at its asynchronous clear terminal C, with the output signal of the reset extending circuit 14 at its D input terminal and with an external clock signal CLK at its clock input terminal, and inputs the Q output signal to the clock input terminal of the D-FF 12. It supplies an "H" level from its Q output terminal upon the rise of the clock signal CLK next to the variation of the input signal from the D input terminal of the D-FF 15 from the "L" to the "H" level, and this variation of the Q output signal from the "L" to the "H" level causes the Q output signal of the D-FF 12 to vary from the "L" to the "H" level.

Further upon the rise of the clock signal CLK next to the variation of this Q output signal of the D-FF 12 from the "L" to the "H" level, the counter circuit in the reset extending circuit 14 begins counting up or down. To the AND gate 17 are inputted the Q output signal of the D-FF 12 and the output signal of the inverter 16, and a signal representing their logical product is supplied from outside as the reset output signal RSTB.

The overall flow of signals is such that the output signal of the reset extending circuit 14 ROUT varies from the "L" to the "H" level upon the rise of the first clock signal CLK after power supply is turned on, and this variation causes the Q output signal of the D-FF 15 to vary from "L" to "H". This variation of the Q output signal of the D-FF 15 from "L" to "H" is detected by the D-FF 12 as indicating the rise of the clock signal CLK, and the D-FF 12 supplies an "H" level signal from its Q output terminal.

The supply of the "H" level signal from the Q output terminal of the D-FF 12 causes the counter circuit in the reset extending circuit 14 to start counting up or down and, after the lapse of a prescribed length of time, to supply an "L" level signal to the output terminal OUT of the reset extending circuit 14. Finally, the AND gate 17 supplies the reset output signal RSTB of the "L" level from the time power supply is turned on until the lapse of a prescribed length of time.

Figure 2:
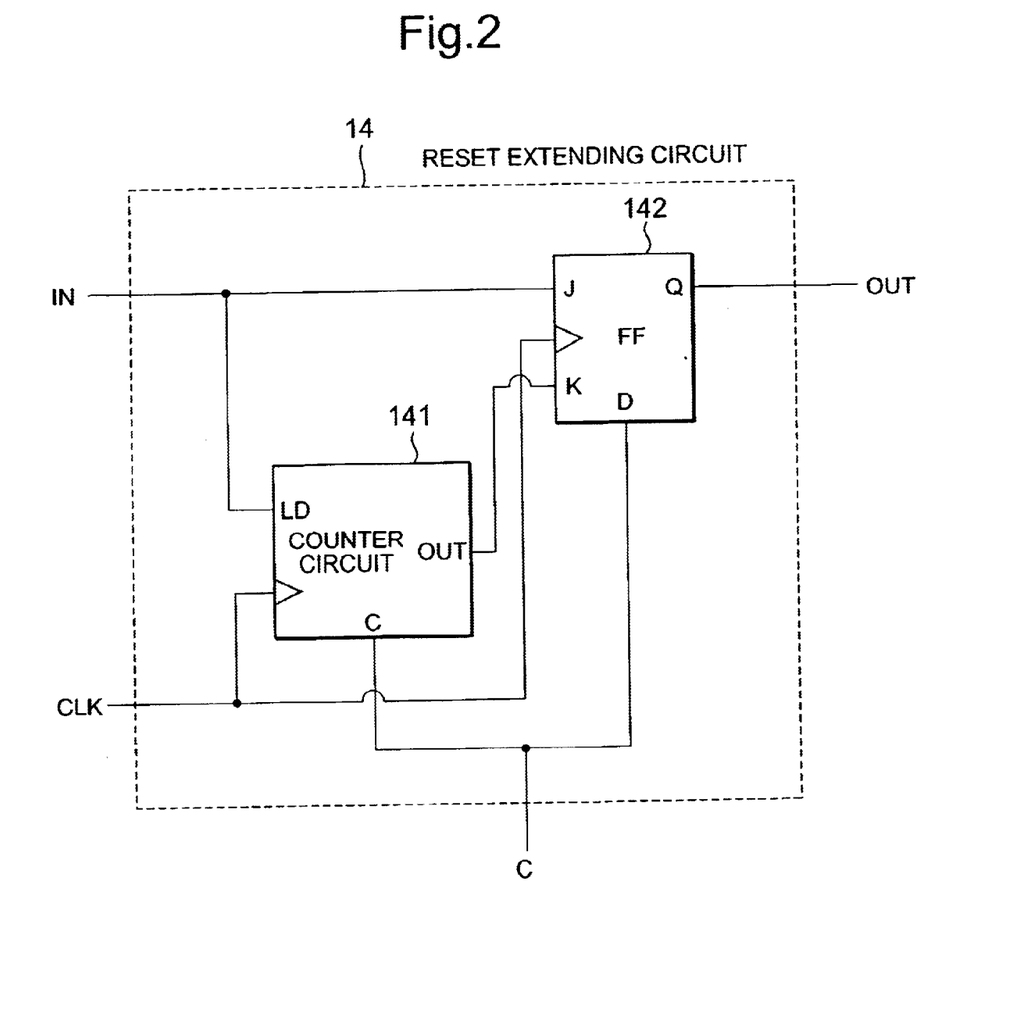
FIG. 2 is a circuit diagram of one mode of implementing the reset extending circuit shown in FIG. 1.

Next will be described the detailed configuration of the reset extending circuit 14. FIG. 2 is a circuit diagram of one mode of implementing the reset extending circuit 14. As shown in this diagram, the reset extending circuit 14 consists of a counter circuit 141 and a J-K flip-flop (J-KFF) 142. In the counter circuit 141, the input terminal LD is connected to the external input terminal IN, the clock signal CLK is inputted to the clock input terminal, an external clear signal is inputted to the asynchronous clear terminal C, and the output terminal OUT is connected to the K terminal of the J-KFF 142.

In the J-KFF 142, the J terminal is connected to the external input terminal IN, the external clear signal is inputted to the asynchronous clear terminal C, the clock signal CLK is inputted to the clock input terminal, and the Q output terminal is connected to the external output terminal OUT. When the input signal to the external input terminal IN is at the "H" level, the counter circuit 141 sets a prescribed count in the register of the counter, and holds the "L" level as the output signal of the output terminal OUT, while the J-KFF 142, as its J terminal is at "H" and its K terminal is at "L", supplies an "H" level signal to the Q output terminal upon the rise of the clock signal CLK.

When the input signal of the external input terminal IN takes on the "L" level, from that point of time onwards, the counter circuit 141 starts counting up or down upon the rise of the first clock signal CLK and, when a prescribed point of time is reached, supplies an "H" level signal to the output terminal OUT. As this "H" level output turns the J terminal to "L" and the K terminal to "H" in the J-KFF 142, an "L" level signal is supplied to the Q output terminal upon the next rise of the clock signal CLK. The flow of signals in the reset extending circuit 14 is in synchronism with the rise of the clock signal CLK, the circuit supplies an "H" level signal to the output terminal OUT when an "H" level signal is inputted to the external input terminal IN and, after the lapse of a prescribed length of time from the input of an "L" level signal to the external input terminal IN, an "L" level signal is supplied to the output terminal OUT.

Next will be described the operation of the embodiment of the invention shown in FIG. 1 and FIG. 2 with additional reference to the timing chart of FIG. 3. In this embodiment, as power supply is turned on the source voltage VCC rises to reach a prescribed level as shown in FIG. 3(A), and at the time the power supply is turned on an external power source monitoring device asserts an external power-on reset signal POWRSTB as shown in FIG. 3(C). Whereas this external power-on reset signal POWRSTB is negated at a subsequent point of time T0 (this point of time T0 is dependent on the configuration of the external power source monitoring device), this embodiment is characterized in that, at the time of that negation, the reset output signal RSTB continues to be supplied at the "L" level for a prescribed length of time even if the external input clock signal CLK is suspended as shown in FIG. 3(B).

Thus, although the external power-on reset signal POWRSTB is negated at the point of time T0 as shown in FIG. 3(C), no external clock signal CLK is entered until then as shown in FIG. 3(B). The external power-on reset signal POWRSTB is inverted in polarity by the inverter 11 and inputted to the asynchronous clear terminals C of the D-FFs 12 and 15 and of the reset extending circuit 14, initializes (clears) the D-FFs 12 and 15 and the reset extending circuit 14 at the time of the assertion mentioned above, and reduces the Q output signals FF2OUT and FF4OUT of the D-FFs 12 and 15 and the output signal ROUT of the output terminal OUT of the reset extending circuit 14 to the "L" level as shown in FIGS. 3(D), (E) and (F), respectively.

Since the Q output signal FF2OUT of the D-FF 12 is at the "L" level, the reset output signal RSTB is also at the "L" level as shown in FIG. 3(G). Further, since the input signal of the external input terminal IN of the reset extending circuit 14 derives from the polarity inversion of the Q output signal FF2OUT by the inverter 13, it is at the "H" level. Whereas the state described above stays on and after that, at the point of time T0, the external power-on reset signal POWRSTB is negated as shown in FIG. 3(C), and the reset output signal RSTB remains at the "L" level as shown in FIG. 3(G) because the Q output signal FF2OUT of the D-FF 12 is at the "L" level.

Figure 3:
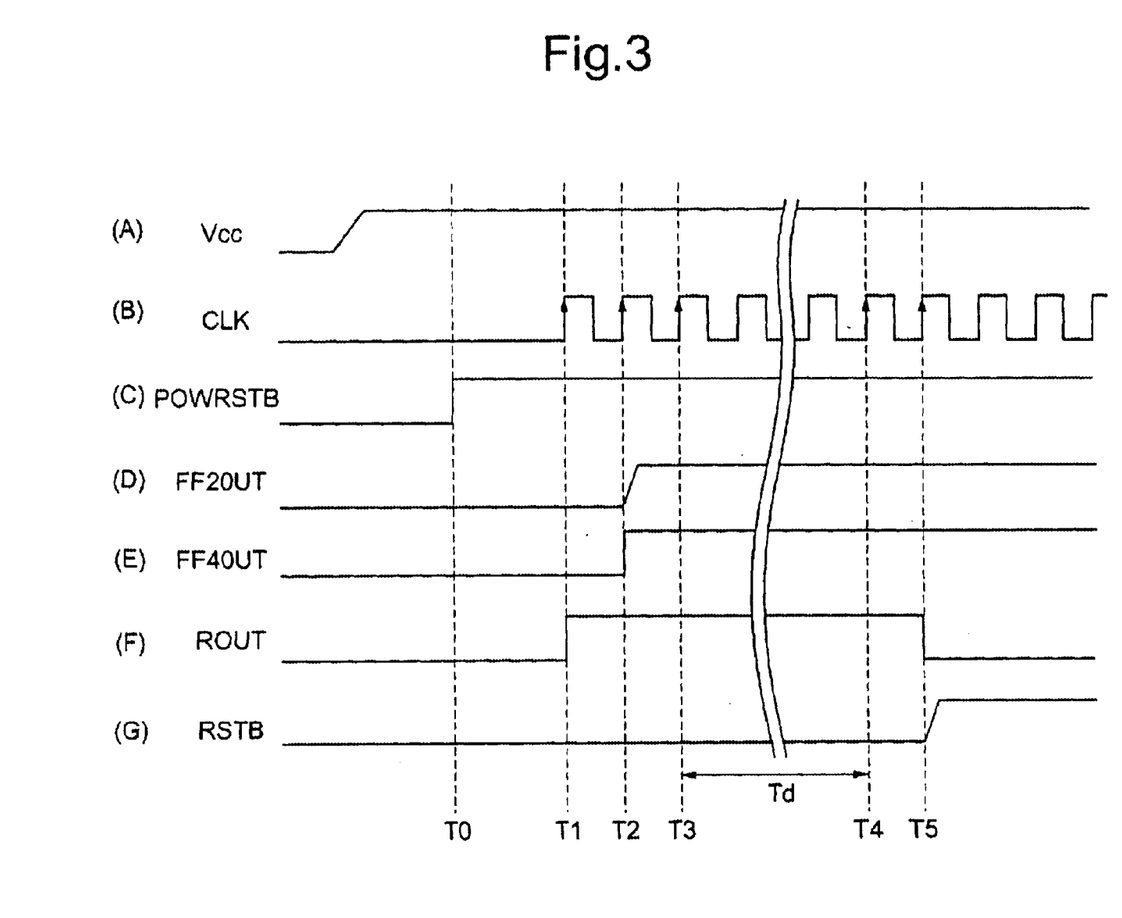

After that, even if the output signal ROUT of the reset extending circuit 14 takes on the "H" level at the first rise time T1 of the clock signal CLK as shown in FIG. 3 (F), as the Q output signal FF2OUT continues to hold the "L" level from the point of time T0 onwards as shown in FIG. 3(D), the output reset signal RSTB remains at the "L" level as shown in FIG. 3(G).

Then upon the rise of the clock signal CLK at the point of time T2, the Q output signal FF4OUT of the D-FF 15 takes on the "H" level as shown in FIG. 3(E), but the reset output signal RSTB supplied from the AND gate 17 remains at the "L" level as shown in FIG. 3(G) because FF2OUT stays at the "L" level as at the point of time T1. Further as the Q output signal FF4OUT varied from the "L" level to the "H" level at the point of time T2, the Q output signal FF2OUT of the D-FF 12, which has the Q output signal FF4OUT as its clock input, supplies an "H" level immediately after this rise as shown in FIG. 3(D).

Although the Q output signal FF2OUT of the D-FF 12 takes on the "H" level immediately after the point of time T2, the output reset signal RSTB of the AND gate 17 maintains the "L" level as shown in FIG. 3(G) because the output signal of the reset extending circuit 14 ROUT keeps the "H" level and one input signal supplied via the inverter 16 is at "L".

Then, as the Q output signal FF2OUT of the D-FF 12 takes on the "H" level at the point of time T3, when the input signal of the external input terminal IN of the reset extending circuit 14 varies to the "L" level, the counter circuit 141 in the reset extending circuit 14 shown in FIG. 2 starts counting up or down the clock signal CLK. At the subsequent point of time T4, when the count of the counter circuit 141 reaches a prescribed value set in the counter circuit 141 (when a prescribed length of time Td, which is the product of multiplying one cycle of the clock signal CLK by the prescribed count, has passed), at that point of time T4 the counter circuit 141 supplies an "H" level time-out signal from its output terminal OUT to the K terminal of the J-KFF 142.

Therefore, immediately after the point of time T4, as the K terminal of the J-KFF 142 is at the "H" level and the J terminal is at the "L" level, the Q output signal ROUT of the J-KFF 142 takes on the "L" level as shown in FIG. 3(F) at the point of time T5 upon the first rise of the clock signal CLK after the point of time T4. At this point of time T5, one input signal FF2OUT of the AND gate 17 is at the "H" level as shown in FIG. 3(D) and the other input signal (the polarity-inverted signal of ROUT) supplied from the inverter 16 takes on the "H" level as stated above, the reset signal RSTB of the "H" level is supplied from the AND gate 17 as shown in FIG. 3(G). This stops the extension of the power-on reset output.

As described above, this embodiment of the invention has a configuration in which the Q output signal FF2OUT of the D-FF 12 is raised to the "H" level after the detection of the external power-on reset POWRSTB by the reset extending circuit 14 is confirmed and the Q output signal FF4OUT of the D-FF 15 is raised to the "H" level. For this reason, a power-on reset circuit can be realized without requiring flip-flop addition to allow for the time taken by the. reset extending circuit to detect the external power-on reset signal POWRSTB as according to one example of the prior art, and with no risk of transmitting any abnormal signal to the common signal line on the mother board as a result of a momentary rise of the RSTB output during output extension of the power-on reset signal POWRSTB, a problem witnessed in the other example of the prior art.

Further, this embodiment of the invention makes possible architecture of a system which, in an apparatus of rack configuration, is free from abnormal signal supply to a common signal line shared via a mother board at the time of live insertion or extraction and therefore from erroneous operation as an apparatus because a power-on reset signal can be entered into integrated circuits mounted on a package until the lapse of a certain length of time from the actuation of power supply and until the connection to the signal line on the mother board is stabilized.

Of course it is also possible, while the power-on reset signal POWRSTB entered from an external power source monitoring device at the time of turning on power supply is being asserted, to detect the external power-on reset signal POWRSTB if there is an external clock signal CLK. Incidentally, there is no restriction on the length of time from the time the reset signal RSTB is negated and the input of the external clock signal CLK is started.

Figure 4:
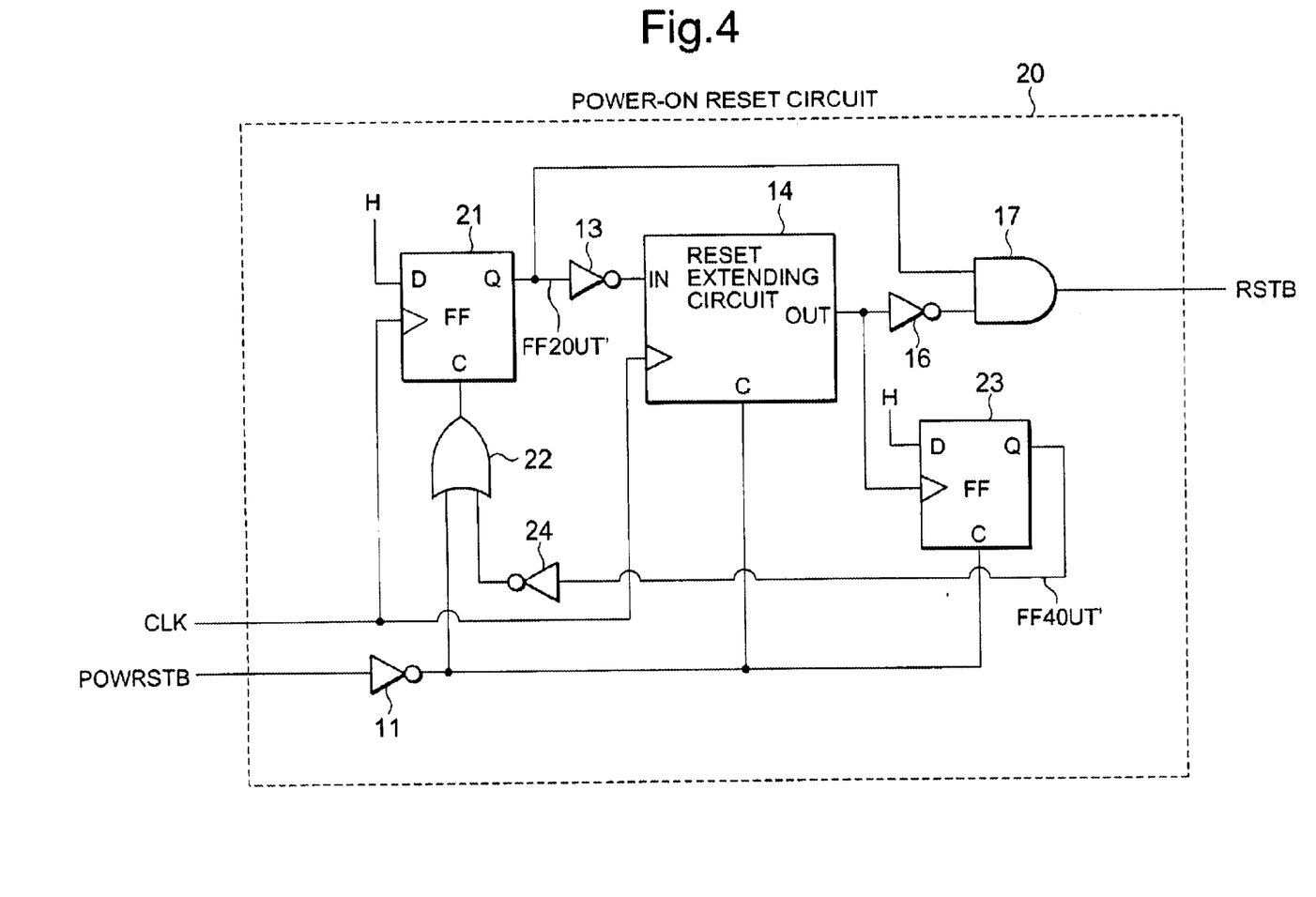
FIG. 4 is a circuit diagram of a second preferred embodiment of the invention.

Next will be described a second preferred embodiment of the present invention. FIG. 4 is a circuit diagram of a power-on reset circuit, which is the second preferred embodiment of the invention. In FIG. 4, the same constituent elements as in FIG. 1 are denoted by respectively the same reference signs, and their description is dispensed with. In FIG. 4, a power-on reset circuit 20 has a configuration in which a D-FF 21 is provided on the input side of the reset extending circuit 14 and the AND gate 17 and a D-FF 23 are provided on the output side of the same; further the output signal of an inverter 24 for inverting the polarity of the Q output signal of the D-FF 23 and that of the inverter 11 for inverting the polarity of the external power-on reset signal POWRSTB are supplied to the asynchronous clear terminal C of the D-FF 21 via a two-input OR gate 22.

In this power-on reset circuit 20, an external clock signal CLK is inputted to the clock terminal of the D-FF 21, the output signal of the reset extending circuit 14 ROUT is inputted to the clock terminal of the D-FF 23, and an "H" level is inputted to the D terminal of the D-FF 23 all the time.

This configuration is similar to the first embodiment in that, whereas the external power-on reset signal POWRSTB is asserted by an external power source monitoring device at the time power supply is turned on and afterwards it is negated, the reset output signal RSTB continues to be supplied at the "L" level for a prescribed length of time even if the external input clock signal CLK is suspended then.

Figure 5:
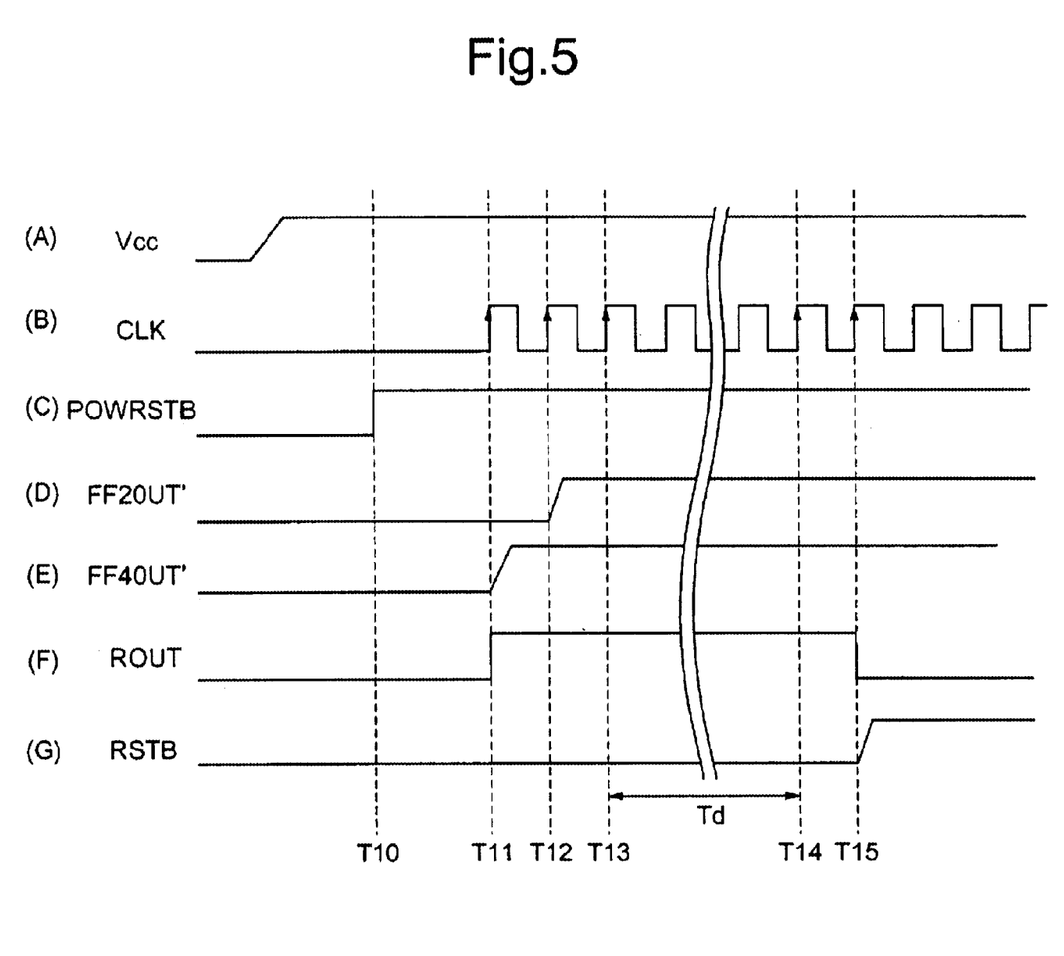

To describe the operation of this embodiment with additional reference to the timing chart of FIG. 5, whereas the external power-on reset signal POWRSTB is negated at a point of time T10 (this point of time T10 is dependent on the configuration of the external power source monitoring device) as shown in FIG. 5(C), no external clock signal CLK is entered until then as shown in FIG. 5(B). Incidentally, FIG. 5(A) represents a source voltage VCC.

The external power-on reset signal POWRSTB is asserted at the time power supply is turned on, inverted in polarity by the inverter 11, inputted to the asynchronous clear terminals C of the D-FF 23 and of the reset extending circuit 14, also inputted to the asynchronous clear terminal C of the D-FF 21 via the OR gate 22, initializes (clears) the D-FF 23, the reset extending circuit 14 and the D-FF 21, and reduces to the "L" level the Q output signals FF2OUT' and FF4OUT' of the D-FFs 21 and 23 and the output signal ROUT of the output terminal OUT of the reset extending circuit 14 as shown in FIGS. 5(D), (E) and (F).

Since the Q output signal FF2OUT' of the D-FF 21 is at the "L" level, the reset output signal RSTB is at the "L" level as shown in FIG. 5(G). Further, as the input signal of the external input terminal IN of the reset extending circuit 14 is a signal resulting from polarity inversion of the Q output signal FF2OUT' by the inverter 13, it is at the "H" level.

As the state described above is sustained, the external power-on reset signal POWRSTB is negated at the point of time T10, the output signal of the reset extending circuit 14 ROUT is raised to the "H" level at the point of time T11 upon the first rise of the clock signal CLK further after that as shown in FIG. 5(F), and an "L" level signal is inputted to the AND gate 17 via the inverter 16, the output reset signal RSTB continues to hold the "L" level as shown in FIG. 5(G).

Further, while the output signal of the reset extending circuit 14 ROUT takes on the "H" level at the point of time T11, the Q output signal of the D-FF 23 FF4OUT' is still in the "L" state at this point of time because of a circuit delay, and accordingly the D-FF 21 to whose asynchronous clear terminal C an "H" level signal is supplied via the inverter 24 and the OR gate 22 is in a clear state. The Q output signal FF4OUT' of the D-FF 23 takes on the "H" level immediately after the point of time T11 as shown in FIG. 5(E), the D-FF21 is released from the clear state. For this reason, the Q output signal FF2OUT' of the D-FF 21 takes on the "H" level at the point of time T12 upon the next rise of the clock signal CLK.

This causes the input signal of the external input terminal IN of the reset extending circuit 14 to take on the "L" level and the counter circuit 141 in the reset extending circuit 14 shown in FIG. 2 to start counting up or down the clock signal CLK at the point of time T13 upon the next rise of the clock signal CLK. At the point of time T14 after the lapse of a prescribed length of time Td from then, the counter circuit 141 supplies an "H" level time-out signal from its output terminal OUT, and the Q output signal ROUT of the J-KFF 142 takes on the "L" level as shown in FIG. 5(F) at the point of time T15 upon the first rise of the clock signal CLK after the point of time T14.

At this point of time T15, one input signal FF2OUT' of the AND gate 17 is at the "H" level as shown in FIG. 5(D), and the other input signal (the polarity-inverted signal of ROUT) supplied from the inverter 16 is also at the "H" level as stated above, the reset signal RSTB of the "H" level is supplied from the AND gate 17 as shown in FIG. 5(G). This stops the extension of the power-on reset output. In this way, the second preferred embodiment of the invention provides a benefit similar to the first embodiment.

As hitherto described, according to the present invention, a power-on reset circuit is enabled, even if the input of an external clock signal is stopped while an power-on reset signal is being asserted, and to supply a power-on reset signal without fail to integrated circuits mounted on the package, for instance, without having to take into consideration the timing at which the input of an external clock signal is started or the length of time taken by the reset extending circuit to detect the power-on reset signal. As a result, it is made possible to release the power-on reset after it has been confirmed that the reset extending circuit has detected the power-on reset signal without fail, and to dispense with the adjustment required by the prior art by adding otherwise unnecessary flip-flops to the power-on reset detecting circuit.

Furthermore, in the power-on reset circuit according to the invention, a power-on reset signal continues to be entered into integrated circuits mounted on the package until the lapse of a certain length of time from the actuation of power supply and until the connection to the signal line on the mother board is stabilized. As a result, it is made possible, by continuing to supply a reset signal for a certain length of time from the actuation of power supply, to architect a system which, in an apparatus of rack configuration, is free from abnormal signal supply to a common signal line shared via a mother board at the time of live insertion or extraction and therefore from erroneous operation as an apparatus.

What is claimed is:

1. A power-on reset circuit comprising:
   an input circuit which is initialized by the assertion of a power-on reset signal entered from outside when power supply is turned on and supplies a first signal of a first logical value at the time a detection signal is entered,
   a reset extending circuit which is initialized by the assertion of said power-on reset signal and, after said power-on reset signal is negated, supplies a second signal which takes on a second logical value when an external clock signal is first entered and a third logical value after the lapse of a prescribed length of time determined by counting said external clock signals after said first signal of said first logical value is entered,
   a detecting circuit which is initialized by the assertion of said power-on reset signal and, after said power-on reset signal is negated, caused to generate said detection signal by the input of said second signal of said second logical value from said reset extending circuit and supply it to said input circuit, and
   a gate circuit which supplies a reset signal of a prescribed logical value when the first signal of said first logical value is supplied from said input circuit and said second signal of said third logical value is supplied from said reset extending circuit.

2. The reset extending circuit, as claimed in claim 1, further provided with:
   a counter circuit which is initialized by the assertion of said power-on reset signal and, after the point of time when said first signal of said first logical value is entered, supplies a time-up signal after the lapse of said prescribed length of time, determined by counting said external clock signals, and an output circuit which is initialized by the assertion of said power-on reset signal and supplies said second signal which takes on said second logical value in synchronism with the first input of said external clock signal and said third logical value in synchronism with the first input of said external clock signal after the input of said time-up signal from said counter circuit.

3. The reset extending circuit, as claimed in claim 1, further provided with:

a first flip-flop which is supplied with said power-on reset signal at its asynchronous clear terminal, initialized by the assertion of the power-on reset signal, supplied with said detection signal at its clock terminal, and supplies said first signal from its output terminal.

4. The reset extending circuit, as claimed in claim 1, further provided with:

a second flip-flop which is supplied with said power-on reset signal at its asynchronous clear terminal, with said external clock signal at its clock terminal, with said second signal from said reset extending circuit at its input terminal, initialized by the assertion of the power-on reset signal and, after the power-on reset signal is negated, caused to generate said detection signal by the input of said second signal of said second logical value from said reset extending circuit and to supply it to the clock terminal of said first flip-flop.

5. A power-on reset circuit comprising:

an input circuit which is initialized by the assertion of a power-on reset signal entered from outside when power supply is turned on or is initialized when a detection signal of a first logical value is entered and, when said power-on reset signal is negated and said detection signal of a second logical value is entered, supplies a first signal of a third logical value in synchronization with an external clock signal, a reset extending circuit which is initialized by the assertion of said power-on reset signal and, after said power-on reset signal is negated, supplies a second signal which takes on a fourth logical value when an external clock signal is first entered and a fifth logical value after the lapse of a prescribed length of time determined by counting said external clock signals after said first signal of said third logical value is entered, a detecting circuit which is initialized by the assertion of said power-on reset signal and, after said power-on reset signal is negated, caused to generate said detection signal of said second logical value by the input of said second signal of said fourth logical value from said reset extending circuit in synchronism with said external clock signal and supply it to said input circuit, and a gate circuit which supplies a reset signal of a prescribed logical value when the first signal of said third logical value is supplied from said input circuit and said second signal of said fifth logical value is supplied from said reset extending circuit.

6. The reset extending circuit, as claimed in claim 5, further provided with:

a counter circuit which is initialized by the assertion of said power-on reset signal and, after the point of time when said first signal of said third logical value is entered, supplies a time-up signal after the lapse of said prescribed length of time, determined by counting said external clock signals, and an output circuit which is initialized by the assertion of said power-on reset signal and supplies said second signal which takes on said fourth logical value in synchronism with the first input of said external clock signal and said fifth logical value in synchronism with the first input of said external clock signal after the input of said time-up signal from said counter circuit.

7. The reset extending circuit, as claimed in claim 5, further provided with:

a logical circuit which supplies an initialization signal resulting from a logical computation of said power-on reset signal and said detection signal, and a first flip-flop which is initialized when it is supplied at its asynchronous clear terminal with said initialization signal from said logical circuit and said power-on reset signal is asserted, or when said detection signal of said first logical value is entered, supplied with said external clock signal at its clock terminal, and supplies said first signal from its output terminal.

8. The reset extending circuit, as claimed in claim 5, further provided with:

a second flip-flop which is supplied with said power-on reset signal at its asynchronous clear terminal, with said second signal from said reset extending circuit at its clock terminal, and with a signal of a prescribed logical value at its input terminal, initialized by the assertion of the power-on reset signal and, after the power-on reset signal is negated, caused to generate said detection signal of said second logical value by the input of said second signal of said fourth logical value from said reset extending circuit and to supply it to said logical circuit.

* * * * *